(12) United States Patent
Hsiao

(10) Patent No.: US 9,554,453 B2
(45) Date of Patent: Jan. 24, 2017

(54) PRINTED CIRCUIT BOARD STRUCTURE WITH HEAT DISSIPATION FUNCTION

(71) Applicant: MediaTek Inc., Hsin-Chu (TW)

(72) Inventor: Shu-Wei Hsiao, Zhudong Township (TW)

(73) Assignee: MEDIATEK INC., Hsin-Chu (TW)

( * ) Notice: Subject to any disclaimer, the term of this patent is extended or adjusted under 35 U.S.C. 154(b) by 393 days.

(21) Appl. No.: 13/777,369

(22) Filed: Feb. 26, 2013

(65) Prior Publication Data
US 2014/0238729 A1 Aug. 28, 2014

(51) Int. Cl.
H05K 1/00 (2006.01)
H05K 1/02 (2006.01)

(52) U.S. Cl.
CPC .......... *H05K 1/0209* (2013.01); *H05K 1/0206* (2013.01); *H05K 2201/0979* (2013.01); *H05K 2201/09609* (2013.01); *H05K 2201/09781* (2013.01); *H05K 2201/10727* (2013.01); *H05K 2201/10969* (2013.01)

(58) Field of Classification Search
CPC .............. H05K 1/02; H05K 1/03; H05K 1/11; H05K 3/00; H01L 21/00; H01L 21/02; H01L 21/48; H01L 21/56; H01L 21/60; H01L 23/12; H01L 23/28; H01L 23/31; H01L 23/34; H01L 23/48; H01L 23/50; H01L 23/52; H01L 23/58; H01L 23/64
USPC ............... 174/252, 255, 258, 261, 262, 266; 361/306.3, 767; 257/668, 684, 691, 698, 257/701, 732, 734, 774, 778
See application file for complete search history.

(56) References Cited

U.S. PATENT DOCUMENTS

| | | | | |
|---|---|---|---|---|
| 4,922,324 A * | 5/1990 | Sudo | ............................. | 257/700 |
| 5,459,634 A * | 10/1995 | Nelson et al. | ............. | 361/306.3 |
| 5,640,048 A * | 6/1997 | Selna | ............................. | 257/738 |
| 5,767,575 A * | 6/1998 | Lan et al. | ..................... | 257/701 |
| 5,959,356 A * | 9/1999 | Oh | ............................... | 257/738 |
| 6,025,640 A * | 2/2000 | Yagi et al. | ..................... | 257/666 |
| 6,034,427 A * | 3/2000 | Lan et al. | ..................... | 257/698 |
| 6,046,495 A * | 4/2000 | Urushima | ..................... | 257/668 |
| 6,058,132 A * | 5/2000 | Iso et al. | ........................ | 372/108 |
| 6,208,020 B1 * | 3/2001 | Minamio et al. | ............. | 257/684 |
| 6,310,303 B1 * | 10/2001 | Luvara et al. | ................ | 174/261 |
| 6,338,984 B2 * | 1/2002 | Minamio et al. | ............. | 438/123 |
| 6,359,341 B1 * | 3/2002 | Huang et al. | ................. | 257/778 |

(Continued)

FOREIGN PATENT DOCUMENTS

| | | |
|---|---|---|
| CN | 101194360 | 6/2008 |
| CN | 101661911 | 3/2010 |

*Primary Examiner* — Xiaoliang Chen
(74) *Attorney, Agent, or Firm* — McClure, Qualey & Rodack, LLP

(57) ABSTRACT

A printed circuit board (PCB) structure with a heat dissipation function is provided, including: a package substrate; a landing pad formed over a portion of the package substrate from a first surface thereof, wherein the landing pad has a rectangular configuration and has a plurality of corners; a plurality of ground traces formed over various portions of the package substrate, physically connecting to the bond pad from at least two of the corners thereof, respectively; a first through hole formed through the landing pad and the package substrate from substantially a center portion of the bonding pad; and a plurality of second through holes formed through the landing pad and the package substrate from substantially one of the corners of the bonding pad, wherein the second through holes are adjacent to the ground traces, respectively.

18 Claims, 7 Drawing Sheets

(56) References Cited

U.S. PATENT DOCUMENTS

| | | | | |
|---|---|---|---|---|
| 6,414,847 | B1* | 7/2002 | Hutchison et al. | 361/704 |
| 6,580,159 | B1* | 6/2003 | Fusaro et al. | 257/668 |
| 6,611,055 | B1* | 8/2003 | Hashemi | 257/706 |
| 6,677,831 | B1* | 1/2004 | Cheng et al. | 333/34 |
| 6,734,545 | B1* | 5/2004 | Yamamura | 257/691 |
| 6,787,895 | B1* | 9/2004 | Jarcy et al. | 257/698 |
| 6,861,746 | B1* | 3/2005 | Waldvogel et al. | 257/706 |
| 6,900,704 | B2* | 5/2005 | Hasegawa | 333/24.2 |
| 8,729,709 | B2* | 5/2014 | Baba et al. | 257/774 |
| 2002/0020929 | A1* | 2/2002 | Kasuga et al. | 257/787 |
| 2002/0024127 | A1* | 2/2002 | Sakuraba et al. | 257/686 |
| 2002/0029875 | A1* | 3/2002 | Takano | 165/185 |
| 2002/0050380 | A1* | 5/2002 | Tanimura et al. | 174/52.1 |
| 2002/0084524 | A1* | 7/2002 | Roh et al. | 257/738 |
| 2002/0096790 | A1* | 7/2002 | Kasuya | 257/787 |
| 2002/0149102 | A1* | 10/2002 | Hashemi et al. | 257/706 |
| 2002/0162678 | A1* | 11/2002 | Takano | 174/52.1 |
| 2002/0167084 | A1* | 11/2002 | Coccioli et al. | 257/732 |
| 2002/0168796 | A1* | 11/2002 | Shimanuki et al. | 438/106 |
| 2002/0172025 | A1* | 11/2002 | Megahed et al. | 361/767 |
| 2003/0002260 | A1* | 1/2003 | Hasebe et al. | 361/720 |
| 2003/0057534 | A1* | 3/2003 | Ho et al. | 257/678 |
| 2003/0060172 | A1* | 3/2003 | Kuriyama et al. | 455/90 |
| 2003/0080418 | A1* | 5/2003 | Suwa et al. | 257/737 |
| 2003/0128532 | A1* | 7/2003 | Somei | 361/777 |
| 2003/0132208 | A1* | 7/2003 | Cutler | 219/121.72 |
| 2003/0132529 | A1* | 7/2003 | Yeo et al. | 257/778 |
| 2003/0155641 | A1* | 8/2003 | Yeo et al. | 257/691 |
| 2004/0021220 | A1* | 2/2004 | Kubo | 257/706 |
| 2004/0119158 | A1* | 6/2004 | Tatt et al. | 257/707 |
| 2004/0155332 | A1* | 8/2004 | Petty-Weeks et al. | 257/734 |
| 2004/0169273 | A1* | 9/2004 | Chiang et al. | 257/734 |
| 2004/0203552 | A1* | 10/2004 | Horiuchi et al. | 455/333 |
| 2004/0207479 | A1* | 10/2004 | Hasegawa | 333/24.2 |
| 2004/0253767 | A1* | 12/2004 | Nurminen | 438/125 |
| 2005/0098886 | A1* | 5/2005 | Pendse | 257/738 |
| 2005/0145414 | A1* | 7/2005 | Tohkairin et al. | 174/252 |
| 2006/0186538 | A1* | 8/2006 | Suzuka | 257/737 |
| 2007/0012751 | A1* | 1/2007 | Waldvogel et al. | 228/256 |
| 2007/0040255 | A1* | 2/2007 | Osone et al. | 257/678 |
| 2009/0101395 | A1* | 4/2009 | Horikiri et al. | 174/255 |
| 2009/0115050 | A1* | 5/2009 | Kasuya et al. | 257/701 |
| 2009/0115072 | A1* | 5/2009 | Rhyner et al. | 257/778 |
| 2010/0052122 | A1* | 3/2010 | Appelt | 257/676 |
| 2010/0282503 | A1* | 11/2010 | Kushta | 174/266 |
| 2011/0156226 | A1 | 6/2011 | Kasuya et al. | |
| 2011/0169170 | A1* | 7/2011 | Baba et al. | 257/774 |
| 2011/0193215 | A1* | 8/2011 | Toyama et al. | 257/691 |
| 2012/0048604 | A1* | 3/2012 | Cornejo et al. | 174/258 |
| 2012/0261166 | A1* | 10/2012 | Oh et al. | 174/252 |
| 2014/0145883 | A1* | 5/2014 | Baks et al. | 343/700 MS |

* cited by examiner

PRINTED CIRCUIT BOARD STRUCTURE WITH HEAT DISSIPATION FUNCTION

BACKGROUND OF THE INVENTION

Field of the Invention

The present invention relates to a printed circuit board (PCB), and more particularly to a printed circuit board (PCB) structure with a heat dissipation function.

Description of the Related Art

With computer technology development, electronic devices now operate at high speeds. It is well known that the higher the speed the electronic devices operate at, the more heat they generate. If the heat is not dissipated duly, the operation stability of the electronic devices will be impacted severely. Generally, in order to ensure that the electronic device will run normally, a heat dissipation device is used to dissipate the heat generated by the electronic device.

Conventionally, a heat dissipation device contacting with an electronic device mounted on a printed circuit board (PCB) includes a heat sink made of solid metal, such as copper alloy, having a fin-like configuration.

Using the heat sink, however, increases fabrication costs and time for an electronic device package comprising the PCB and the electronic device. What is needed, therefore, is a novel PCB structure with a heat dissipation function which eliminates usage of the heat sink.

BRIEF SUMMARY OF THE INVENTION

An exemplary printed circuit board (PCB) structure with a heat dissipation function is provided, comprising: a package substrate; a landing pad formed over a portion of the package substrate from a first surface thereof, wherein the landing pad has a rectangular configuration and has a plurality of corners; a plurality of ground traces formed over various portions of the package substrate, physically connecting to the bond pad from at least two of the corners thereof, respectively; a first through hole formed through the landing pad and the package substrate from substantially a center portion of the bonding pad; and a plurality of second through holes formed through the landing pad and the package substrate from substantially one of the corners of the bonding pad, wherein the second through holes are adjacent to the ground traces, respectively.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
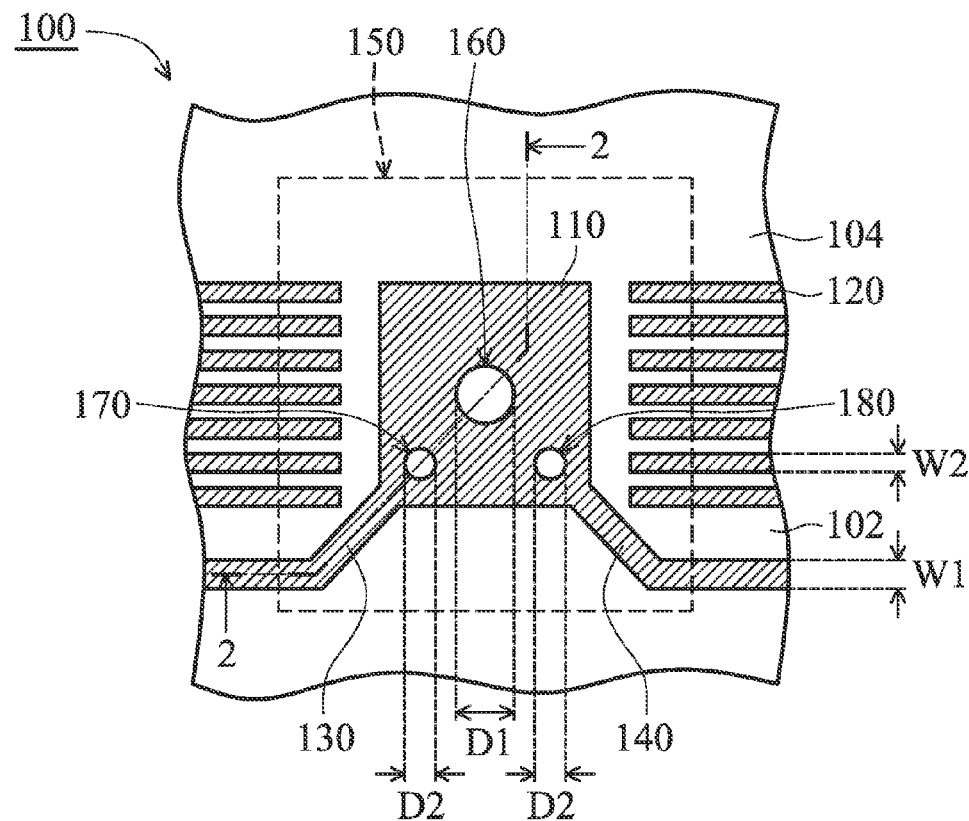
FIG. 1 is a schematic top view of a printed circuit board (PCB) structure according to an embodiment of the invention.
Figure 2:
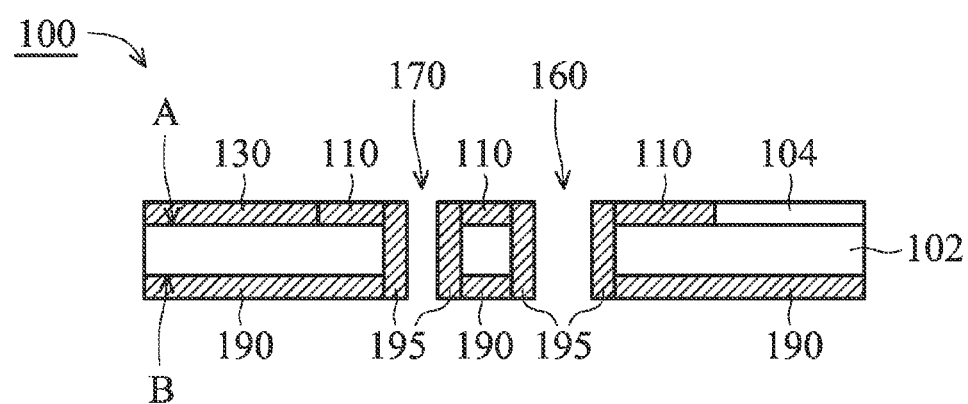
FIG. 2 is a schematic cross section of the PCB structure taken along line 2-2 in FIG. 1.
Figure 3:
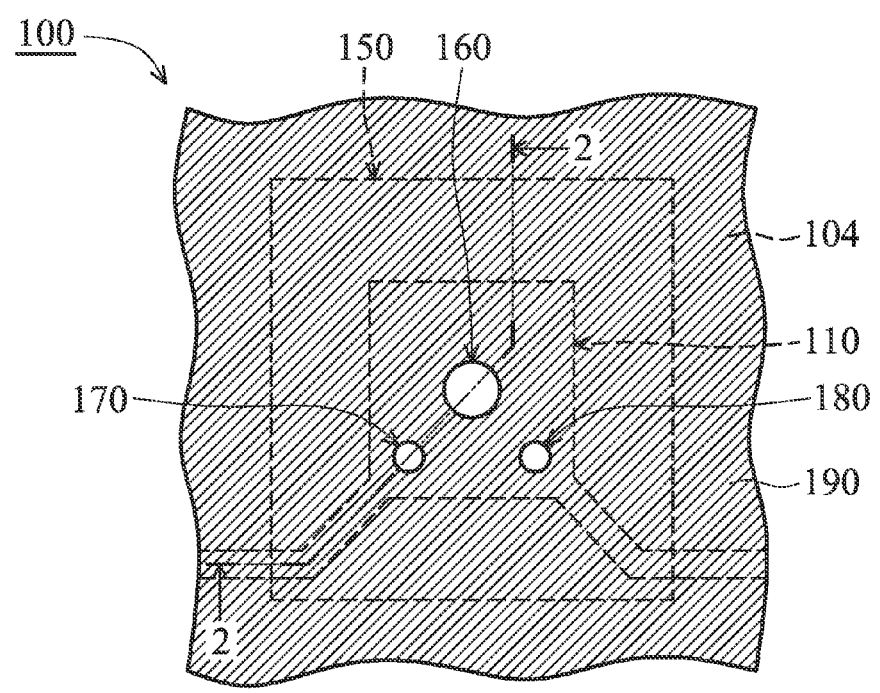
FIG. 3 is a schematic bottom view of the PCB structure shown in FIG. 1.

FIGS. 1-3 are schematic diagrams showing an exemplary printed circuit board (PCB) structure 100 with a heat dissipation function which eliminates usage of a heat sink over an electronic device package, wherein FIG. 1 shows a schematic top view of the PCB structure 100, and FIG. 2 shows a schematic cross section of the PCB structure 100 taken along line 2-2 in FIG. 1, and FIG. 3 shows a schematic bottom view of the PCB structure 100.

In FIG. 1, a printed circuit board (PCB) structure 100 with a heat dissipation function for an electronic device package (not shown) is partially illustrated. An area 150 is defined over the PCB structure 100 for receiving an electronic device package which has a semiconductor chip with a predetermined function packaged with a non ball-grid-array (non-BGA) configuration, such as a configuration of small outline package (SOP), quad flat package (QFP), or qual flat no-lead (QFN) package. In addition, the PCB structure 100 comprises a landing pad 110, a plurality of conductive traces 120, and two ground traces 130 and 140.

As shown in FIG. 1, the landing pad 110 is substantially located at a center of the area 150, having a substantially rectangular shape. The plurality of the conductive traces 120 are aligned in parallel and are provided on opposite sides of the landing pad 110. The conductive traces 120 are isolated therefrom by a solder mask layer 104, wherein each of the conductive traces 120 may be wire bonded to a lead of the electronic device package (not shown) sequentially mounted over the area 150. Configuration of the conductive traces is not limited by that shown in FIG. 1, and may be provided on more than two sides of the landing pad 110 based on a design of the lead configuration of the electronic device package (not shown). The two ground traces 130 and 140 are provided from the lower two corners of the landing pad 110 to physically connect to the landing pad 110 from one of the lower corners of the landing pad 110, respectively. In one embodiment, the landing pad 110 may comprise copper coil.

In one embodiment, the ground traces 130 and 140 are conductive traces coupled to a ground plane or a ground element (both not shown) provided over other portions of the PCB structure 100. The ground traces 130 and 140 may comprise copper coil and be provided with a line width W1, which is greater than a line width W2 of the conductive traces 120. In one embodiment, the line width W1 of the ground traces 130 and 140 are about 16-20 mil, and the line width W2 of the conductive traces 120 are about 6-8 mil.

Still referring to FIG. 1, a plurality of through holes 160, 170 and 180 with circular top views are formed through the PCB structure 100 at various locations over the landing pad 110. As shown in FIG. 1, the through hole 160 is formed at a center of the landing pad 110, and the through holes 170 and 180 are formed at a place near one of the lower corners of the landing pad 110, respectively. The through hole 160 is formed with a diameter D1 greater than a diameter D2 of the through holes 170 and 180. In one embodiment, the diameter D1 of the through hole 160 is about 1.8-2.0 mm, and the diameter D2 of the through holes 170 and 180 is about 0.8-1.2 mm. In the PCB structure 100 shown in FIG. 1, after an electronic device package (not shown) is mounted over the area 150, the through holes 160, 170, and 180, and the ground traces 130 and 140 may function as heat dissipation elements to dissipate heat generated by the semiconductor chip in the electronic device package (not shown) during operation thereof, such that a conventional heat sink is no longer needed to be mounted over the electronic device package.

In FIG. 2, a schematic cross section of the PCB structure 100 taken along line 2-2 in FIG. 1 is shown. The PCB structure 100 comprises a package substrate 102 made of insulating materials such as glass fibre, epoxy, or FR-4 materials. The landing pad 110 and a solder mask layer 104 are defined and formed over a top surface A of the package substrate 102 for receiving the electronic device package (not shown). In addition, a conductive layer 190 (see FIG. 3) is blanketly formed over a bottom surface B of the package substrate 102 opposite to the top surface A. A conductive layer 195 is formed on sidewalls of the package substrate 102, the landing pad 110, and the conductive layer 190 exposed by the through holes 160, 170, and 180, thereby connecting the landing pad 110 with the conductive layer 190. In one embodiment, the conductive layer 195 may conductive materials such as copper. Due to connections of the landing pad 110 with the ground traces 130 and 140 and the conductive layer 190, most of the heat generated by the electronic device package (not shown) mounted over the landing pad 110 can be dissipated away through the ground traces 130 and 140 and the conductive layer 190 by thermal conduction during operation thereof. In addition, due to formations of the through holes 160, 170, and 180 (shown in FIGS. 1 and 3), portions of the heat generated by the semiconductor chip in the electronic device package (not shown) mounted over the landing pad 110 can be thermally diffused to the bottom surface B of the package substrate 102 through the through holes 160, 170, and 180. FIG. 3 shows a schematic bottom view of the PCB structure 100 shown in FIGS. 1 and 2. As shown in FIG. 3, the conductive layer 190 is blanketly formed over the bottom B of the package substrate 102 (see FIG. 2). In one embodiment, the conductive layer 190 may not blanketly formed over the bottom surface B of the package substrate 102, and a plurality of conductive traces (not shown) isolated from the conductive layer 190 can be also formed over the bottom surface B of the package substrate 102 based on a design of the PCB structure 100.

It is noted that numbers and locations of the ground traces connecting to the landing pad 110 may be varied in other embodiments, and are not limited by that illustrated in FIGS. 1-3.

Figure 4:
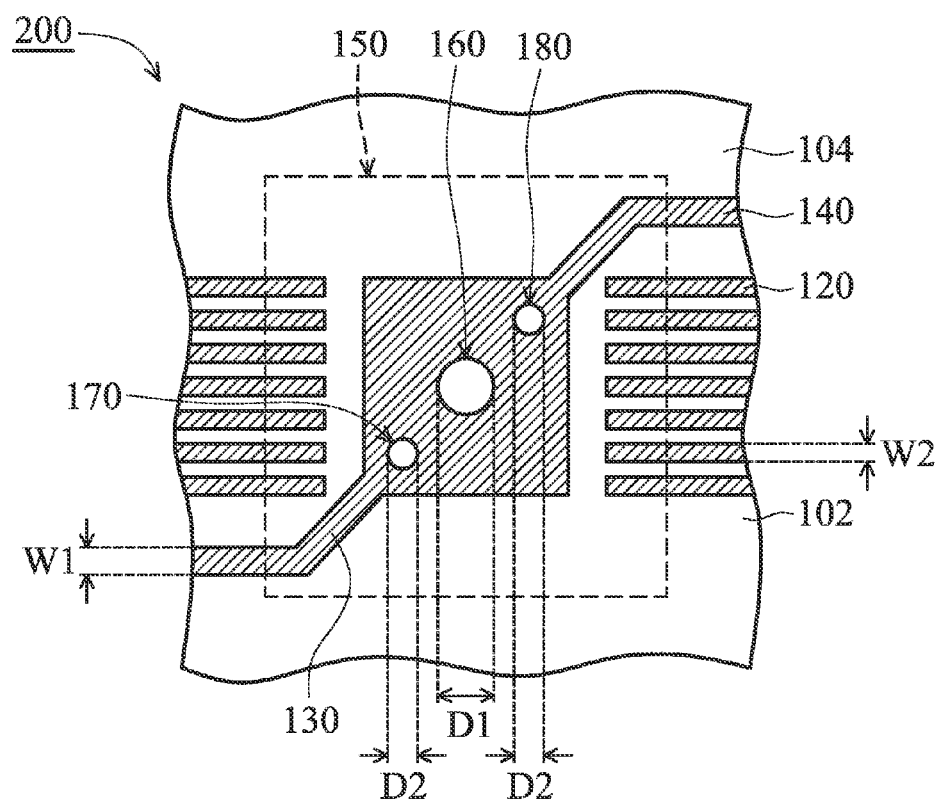
FIG. 4 is a schematic top view of a printed circuit board (PCB) structure according to another embodiment of the invention.

FIG. 4 is a schematic top view of another exemplary printed circuit board (PCB) structure 200 with a heat dissipation function which eliminates usage of a heat sink over an electronic device package. The PCB structure is modified from the PCB structure 100 shown in FIGS. 1-3. Herein, similar components are illustrated with the same reference number in FIG. 4, and only differences between the PCB structures 100 and 200 are discussed as follows for the purpose of simplicity.

In FIG. 4, the ground trace 140 is now formed from an upper right corner of the landing pad 110 to physically connect to the landing pad 110, and the through hole 180 is now formed at a place near the upper right corner of the landing pad 110. After an electronic device package (not shown) is mounted over the area 150, the thorough holes 160, 170, and 180, and the ground traces 130 and 140 may function as heat dissipation elements to dissipate heat generated by the semiconductor chip in the electronic device package (not shown) during operation thereof, such that a conventional heat sink is no longer needed to be mounted over the electronic device package.

Figure 5:
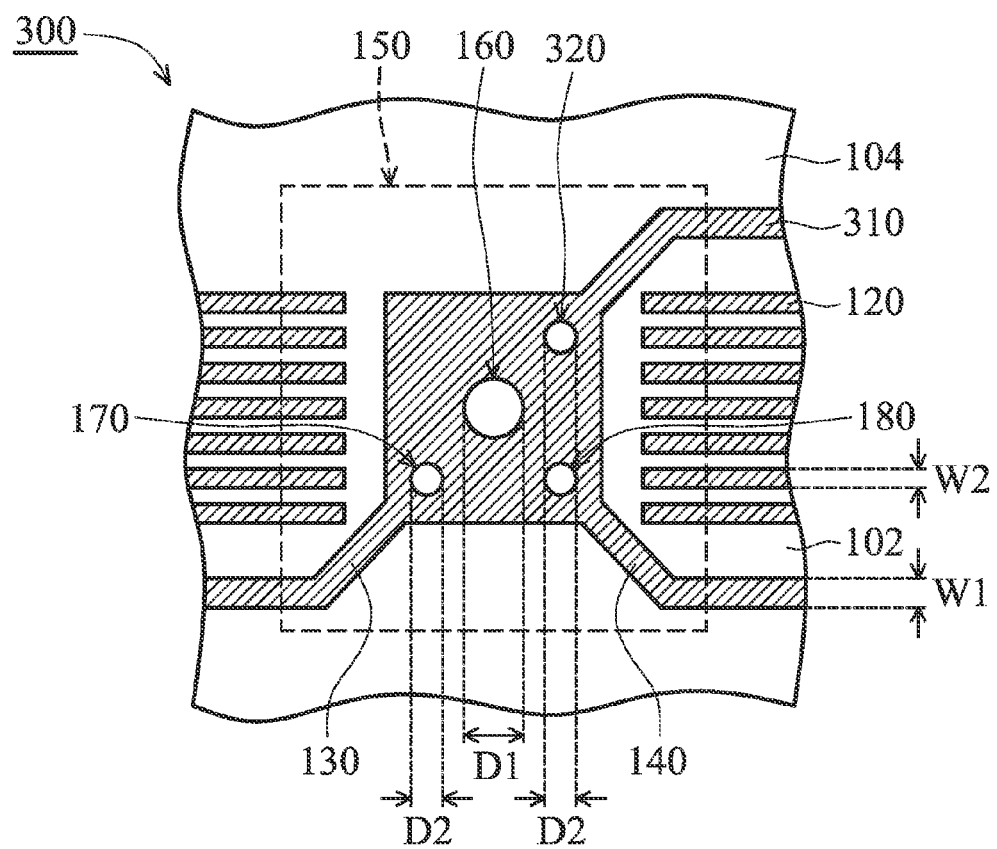
FIG. 5 is a schematic top view of a printed circuit board (PCB) structure according to yet another embodiment of the invention.

FIG. 5 is a schematic top view of yet another exemplary printed circuit board (PCB) structure 300 with a heat dissipation function which eliminates usage of a heat sink over an electronic device package. The PCB structure is modified from the PCB structure 100 shown in FIGS. 1-3. Herein, similar components are illustrated with the same reference numbers, and only differences between the PCB structures 100 and 300 are discussed as follows for the purpose of simplicity.

In FIG. 5, an additional ground trace 310 is now formed from an upper right corner of the landing pad 110 to physically connect to the landing pad 110. An additional through hole 320 similar with the through holes 130 and 140 formed through the PCB structure 500 is provided over the landing pad 110 at a place near the upper right corner thereof.

In the PCB structure 300 shown in FIG. 5, after an electronic device package (not shown) is mounted over the area 150, the through holes 160, 170, 180, and 320, and the ground traces 130, 140, and 310 may function as heat dissipation elements to dissipate heat generated by the semiconductor chip of the electronic device package (not shown) during operation thereof, such that a conventional heat sink is no longer needed to be mounted over the electronic device package.

Figure 6:
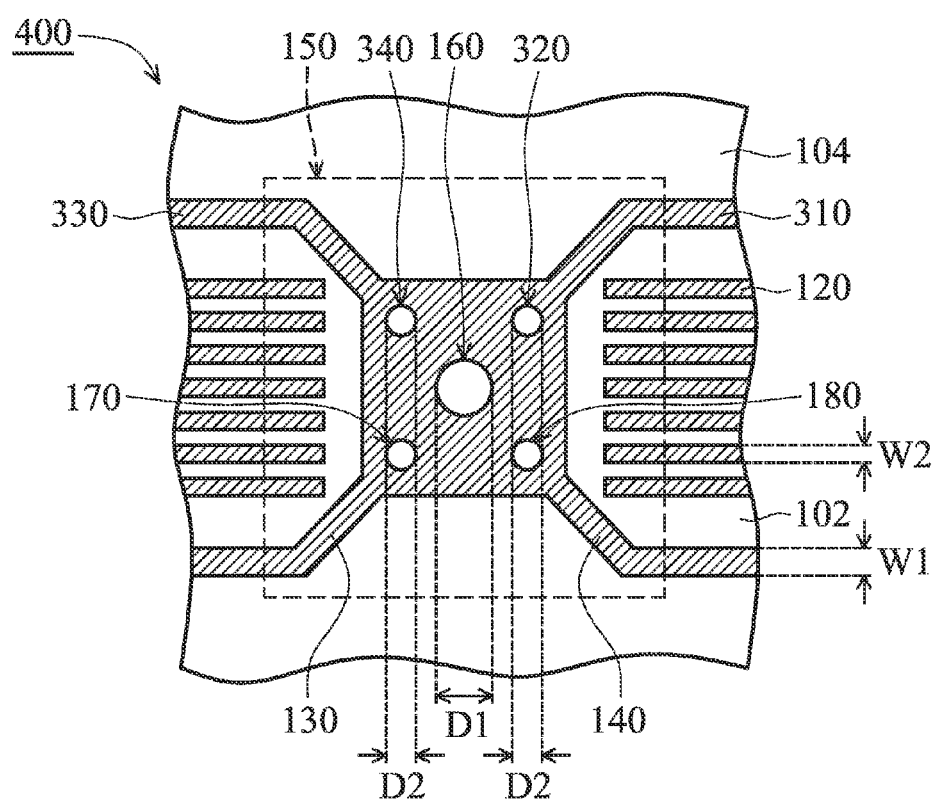
FIG. 6 is a schematic top view of a printed circuit board (PCB) structure according to another embodiment of the invention.

FIG. 6 is a schematic top view of yet another exemplary printed circuit board (PCB) structure 400 with a heat dissipation function which eliminates usage of a heat sink over an electronic device package. The PCB structure is modified from the PCB structure 300 shown in FIG. 5. Herein, similar components are illustrated with the same reference number, and only differences between the PCB structures 400 and 300 are discussed as follows for the purpose of simplicity.

In FIG. 6, an additional ground trace 330 is now formed from an upper left corner of the landing pad 110 to physically connect to the landing pad 110. An additional through hole 340 similar with the through holes 170, 180 and 320 formed through the PCB structure 600 is provided over the landing pad 110 at a place near the upper left corner of the landing pad 110.

In the PCB structure 400 shown in FIG. 6, after an electronic device package (not shown) is mounted over the area 150, the thorough holes 160, 170, 180, 320, and 340, and the ground traces 130, 140, 310, and 330 may function as heat dissipation elements to dissipate heat generated by the semiconductor chip of the electronic device package during operation thereof, such that a conventional heat sink is no longer needed to be mounted over the electronic device package.

Figure 7:
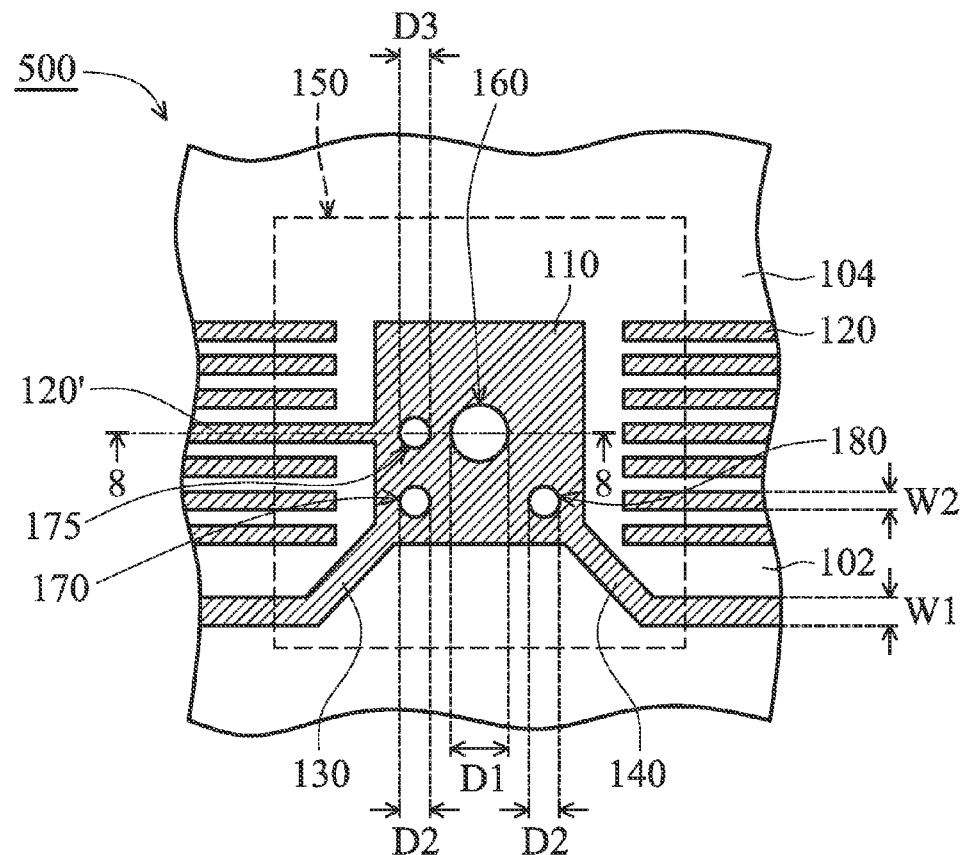
FIG. 7 is a schematic top view of a printed circuit board (PCB) structure according to another embodiment of the invention.

FIG. 7 is a schematic top view of another exemplary printed circuit board (PCB) structure 500 with a heat dissipation function which eliminates usage of a heat sink over an electronic device package. The PCB structure is modified from the PCB structure 100 shown in FIGS. 1-3. Herein, similar components are illustrated with the same reference number in FIG. 7, and only differences between the PCB structures 100 and 500 are discussed as follows for the purpose of simplicity.

In FIG. 7, one of the conductive traces 120 adjacent to a middle portion of the left side of the landing pad 110 (entitled with a reference number 120') now further extends toward the landing pad 110 to physically connect with the landing pad 110. Similar with the through holes 160 and 170, a through hole 175 with a diameter D3 of about 0.8-1.2 mm is formed through a portion of the landing pad 110 at a place adjacent to the conductive trace 120' connected with the landing pad 110. The conductive trace 120' also functions as a ground trace similar with the ground traces 130 and 140. After an electronic device package (not shown) is mounted over the area 150, the thorough holes 160, 170, 175, and 180, and the ground traces 120', 130 and 140 may function as heat dissipation elements to dissipate heat generated by the semiconductor chip in the electronic device package (not shown) during operation thereof, such that a conventional heat sink is no longer needed to be mounted over the electronic device package.

Figure 8:
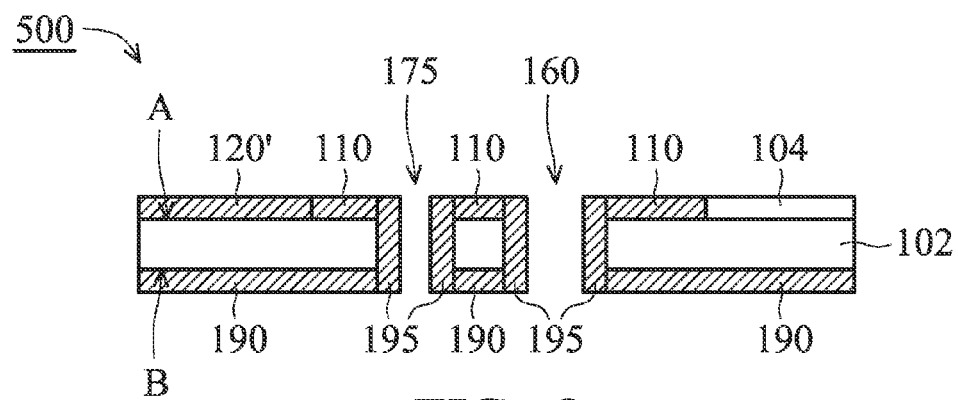
FIG. 8 is a schematic cross section of the PCB structure taken along line 8-8 in FIG. 7.
Figure 9:
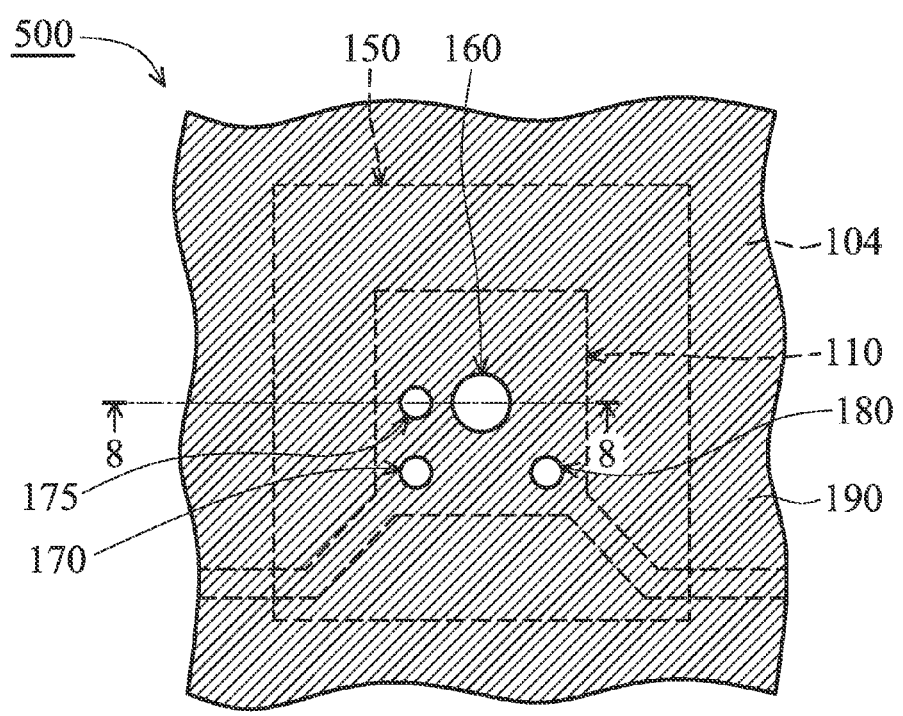
FIG. 9 is a schematic bottom view of the PCB structure shown in FIG. 7.

In FIG. 8, a schematic cross section of the PCB structure 500 taken along line 8-8 in FIG. 7 is shown. The PCB structure 500 comprises the package substrate 102, and the landing pad 110 and the solder mask layer 104 are defined and formed over a top surface A of the package substrate 102 for receiving the electronic device package (not shown). In addition, the conductive layer 190 (see FIG. 9) is blanketly formed over a bottom surface B of the package substrate 102 opposite to the top surface A. A conductive layer 195 is formed on sidewalls of the package substrate 102, the landing pad 110, and the conductive layer 190 exposed by the through holes 160 and 175, thereby connecting the landing pad 110 with the conductive layer 190. Due to connections of the landing pad 110 with the ground trace 120' and the conductive layer 190, most of the heat generated by the electronic device package (not shown) mounted over a predetermined place such as the middle portion of the left side of the landing pad 110 can be dissipated away through the ground trace 120' and the conductive layer 190 by thermal conduction during operation thereof, thereby locally reduced heat generated at a predetermined portion of the electronic device package (not shown). In addition, due to formations of the through holes 160, 170, 175, and 180 (shown in FIGS. 7 and 9), portions of the heat generated by the semiconductor chip in the electronic device package (not shown) mounted over the landing pad 110 can be thermally diffused to the bottom surface of the package substrate 102 through the through holes 160, 170, 175, and 180. FIG. 9 shows a schematic bottom view of the PCB structure 500 shown in FIGS. 7 and 8. As shown in FIG. 9, the conductive layer 190 is blanketly formed over the back surface B of the package substrate 102 (see FIG. 8). In one embodiment, the conductive layer 190 may not blanketly formed over the back side surface B of the package substrate 102, and a plurality of conductive traces (not shown) isolated from the conductive layer 190 can be also formed over the back side surface B of the package substrate 102 based on a design of the PCB structure 100.

It is noted that numbers and locations of the additional ground trace 120' connecting to the landing pad 110 may be varied in other embodiments to locally reduce heat generated at a predetermined portion of the electronic device package (not shown) formed over the landing pad 110, and are not limited by that illustrated in FIGS. 7-9.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A printed circuit board (PCB) structure with a heat dissipation function, comprising:
    a package substrate, wherein an area for mounting an electronic device package is defined over the package substrate, wherein the electronic device package has a configuration of a non ball-grid-array type package;
    a landing pad formed over a portion of the package substrate from a first surface thereof, wherein the landing pad has a rectangular configuration and has a plurality of corners;
    a plurality of ground traces formed over various portions of the package substrate, physically connecting to the landing pad from at least two of the corners thereof, respectively;
    a first through hole formed through the landing pad and the package substrate from substantially a center portion of the landing pad; and
    a plurality of second through holes formed through the landing pad and the package substrate from substantially one of the corners of the landing pad, wherein the second through holes are adjacent to the ground traces, respectively;
    wherein the first through hole and the second through holes are open so that air may flow through the first through hole and the second through holes.

2. The PCB structure as claimed in claim 1, further comprising a plurality of conductive traces formed over the package substrate from a side of the landing pad.

3. The PCB structure as claimed in claim 1, wherein two ground traces are formed over various portions of the package substrate, physically connecting to the landing pad from two adjacent corners thereof.

4. The PCB structure as claimed in claim 1, wherein two ground traces are formed over various portions of the package substrate, physically connecting to the landing pad from two opposite corners thereof.

5. The PCB structure as claimed in claim 1, wherein three ground traces are formed over various portions of the package substrate, physically connecting to the landing pad from three adjacent corners thereof.

6. The PCB structure as claimed in claim 1, wherein four ground traces are formed over various portions of the package substrate, physically connecting to the landing pad from each corners thereof.

7. The PCB structure as claimed in claim 1, further comprising a conductive layer formed over a portion of a second surface of the package substrate, wherein the second surface is opposite to the first surface, and the conductive layer is adjacent to one of the second through hole.

8. The PCB structure as claimed in claim 1, wherein the package substrate comprises glass fiber, epoxy, or FR-4 materials.

9. The PCB structure as claimed in claim 1, wherein the landing pad and the ground traces comprise copper foil.

10. The PCB structure as claimed in claim 1, wherein the first through hole has a diameter of about 1.8-2.0 mm.

11. The PCB structure as claimed in claim 1, wherein the second through holes have a diameter of about 0.8-1.2 mm.

12. The PCB structure as claimed in claim 1, wherein the ground traces have a line width of about 16-20 mil.

13. The PCB structure as claimed in claim 2, wherein the conductive traces have a line width of about 6-8 mil.

14. The PCB structure as claimed in claim 1, wherein the area for mounting an electronic device package comprises the landing pad, the first through hole, the second through hole, and portions of the ground traces.

15. The PCB structure as claimed in claim 1, wherein the package of the electronic device is a small outline package, a quad flat package, or a qual flat no-lead package.

16. The PCB structure as claimed in claim 2, further comprising:
   another ground trace formed over the package substrate from a side of the landing pad and formed between the conductive traces; and
   a third through hole formed through the landing pad and the package substrate from a portion of the landing pad adjacent to the another ground trace.

17. The PCB structure as claimed in claim 16, wherein the ground trace formed between the conductive traces physically connects with the landing pad.

18. The PCB structure as claimed in claim 7, further comprising another conductive layer formed on sidewalls of the landing pad, the package substrate, and the conductive layer exposed by the first and second through holes.

* * * * *